United States Patent
Shin et al.

(10) Patent No.: US 7,792,204 B2
(45) Date of Patent: Sep. 7, 2010

(54) APPARATUS AND METHOD FOR AUTOMATIC GAIN CONTROL IN A BROADBAND WIRELESS ACCESS COMMUNICATION SYSTEM

(75) Inventors: Yong-Won Shin, Suwon-si (KR); Soo-Bok Yeo, Suwon-si (KR); Yong-Sun Hwang, Suwon-si (KR); Bong-Gee Song, Seongnam-si (KR); Jong-Han Lim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 650 days.

(21) Appl. No.: 11/882,596

(22) Filed: Aug. 2, 2007

(65) Prior Publication Data

US 2008/0031387 A1    Feb. 7, 2008

(30) Foreign Application Priority Data

Aug. 3, 2006    (KR) ...................... 10-2006-0073183

(51) Int. Cl.
H04L 27/28    (2006.01)
H04L 27/08    (2006.01)

(52) U.S. Cl. ...................................... 375/260; 375/345

(58) Field of Classification Search ................. 375/260, 375/345, 350; 341/114, 155; 455/63.1, 234.1
See application file for complete search history.

(56) References Cited

U.S. PATENT DOCUMENTS

| 2006/0068733 A1* | 3/2006 | Wang et al. ............... 455/234.1 |
| 2006/0176093 A1* | 8/2006 | Song et al. ................... 327/179 |
| 2008/0260052 A1* | 10/2008 | Hayashi ....................... 375/260 |

\* cited by examiner

*Primary Examiner*—Khai Tran
(74) *Attorney, Agent, or Firm*—Roylance, Abrams, Berdo & Goodman, L.L.P.

(57) ABSTRACT

An AGC apparatus and method in a BWA communication system are provided, in which a MAP interpreter detects a beamformed symbol period in an $(n-1)^{th}$ signal, a symbol power calculator measures an average signal level of a symbol in an $n^{th}$ signal, and a beamforming gain calculator calculates a beamforming gain of the $n^{th}$ signal by adding a beamforming gain of the $(n-1)^{th}$ signal to a power difference between a signal of a beamformed symbol period and a signal of a non-beamformed symbol period in the $n^{th}$ signal using information about the beamformed symbol period of the $(n-1)^{th}$ signal and the average signal level of the symbol in the $n^{th}$ signal.

16 Claims, 8 Drawing Sheets

DATA SYMBOL
(USER DATA INCLUDED)

⋮

DATA SYMBOL
(USER DATA INCLUDED)

DATA SYMBOL
(USER DATA INCLUDED)

DATA SYMBOL
(FRAME INFORMATION INCLUDED)

PREAMBLE

FIG.3

(PRIOR ART)

APPARATUS AND METHOD FOR AUTOMATIC GAIN CONTROL IN A BROADBAND WIRELESS ACCESS COMMUNICATION SYSTEM

CROSS-REFERENCE TO RELATED PATENT APPLICATION

This application claims the benefit under 35 U.S.C. §119 (a) of Korean Patent Application No. 2006-73183, filed Aug. 3, 2006, in the Korean Intellectual Property Office, the entire disclosure of which is hereby incorporated by reference.

BACKGROUND OF THE INVENTION

1. Field of the Invention

The present invention relates to an apparatus and method for Automatic Gain Control (AGC). More particularly, the present invention relates to an AGC apparatus and method in a Broadband Wireless Access (BWA) communication system.

2. Description of the Related Art

The provisioning of services with diverse Quality of Service (QoS) levels at or above 100 Mbps to users is an active study area for a future-generation communication system called a 4$^{th}$ Generation (4G) communication system. Particularly, active research is conducted on the provisioning of high-speed service by ensuring mobility and QoS to a BWA communication system such as Wireless Local Area Network (WLAN) and Wireless Metropolitan Area Network (WMAN). Some major examples are Institute of Electrical and Electronics Engineers (IEEE) 802.16d and IEEE 802.16e for Worldwide Interoperability Microwave Access (WiMAX) or Wireless Broadband (WiBro).

The IEEE 802.16d and IEEE 802.16e communication systems adopt Orthogonal Frequency Division Multiplexing (OFDM)/Orthogonal Frequency Division Multiple Access (OFDMA) for physical channels of the WMAN system in order to support a broadband transmit network. IEEE 802.16d considers only a single-cell structure with no regard to mobility of Subscriber Stations (SSs). In contrast, IEEE 802.16e supports the SSs' mobility to the IEEE 802.16d communication system. A mobile SS is called an MS. Hereinafter, an SS and an MS are referred to as a user terminal.

Typically, a receiver in a wireless communication system includes a variable gain amplifier, particularly an automatic gain controller for automatically controlling the gain of a received signal. The AGC keeps the signal in the dynamic range of a device and provides the signal at a predetermined level to a signal detector.

FIG. 1 is a block diagram of a typical automatic gain controller.

Referring to FIG. 1, a detector 120 measures the energy of a signal received from a Gain Control Amplifier (GCA) 110 and calculates the difference between the energy measurement and a reference value $-V_R$. The GCA 110 receives output data of $H_{F(w)}$ 100, the $H_{F(w)}$ 100 is a system function.

A filter 125 filters the difference so that the energy of the output signal of the GCA 110 equals the reference value $-V_R$ and provides the resulting signal as a control signal to the GCA 110.

FIG. 2 is a block diagram of a typical receiver.

Referring to FIG. 2, a Low Noise Amplifier (LNA) 202 and a first Band Pass Filter 203 (BPF 1) process a Radio Frequency (RF) signal received through an antenna 201. A frequency converter 204 downconverts the processed signal to an Intermediate Frequency (IF) signal.

A second BPF 205 (BPF 2) eliminates noise from the IF signal. A GCA 206 amplifies the noise-free signal and a frequency converter 207 downconverts the amplified signal to a baseband signal.

A Low Pass Filter (LPF) 208 processes the baseband signal, an Analog-to-Digital Converter (ADC) 209 samples the processed signal, and a demodulator 210 demodulates the samples.

FIG. 3 illustrates the basic structure of a downlink frame in a typical IEEE 802.16 communication system.

Referring to FIG. 3, an IEEE 802.16 frame largely includes a preamble symbol, data symbols carrying frame information, and other data symbols carrying user data. A beamformed symbol period can be detected from the frame based on a DownLink-MAP (DL-MAP) carrying frame configuration information in data symbols at the start of the frame.

FIG. 4 is a block diagram of a transmitter in a typical OFDM communication system.

Referring to FIG. 4, an encoder 410 channel-encodes input information bits at a predetermined coding rate in order to render the transmission data robust over a wireless channel. The channel encoding may involve interleaving aiming at robustness against burst errors.

A modulator 415 modulates the interleaved data in a modulation scheme such as Quadrature Phase Shift Keying (QPSK), 16-ary Quadrature Amplitude Modulation (16QAM), or 64-ary QAM (64QAM).

A subcarrier mapper 420 maps the modulated data to subcarriers. An Inverse Fast Fourier Transform (IFFT) processor 425 converts the mapped data to time sample data by IFFT.

A filter 430 is used to make the IFFT signals distinctive and stable. A Digital-to-Analog Converter (DAC) 435 converts the digital signal received from the filter 430 to an analog signal. An RF processor 440 upconverts the analog baseband signal to an RF signal transmittable in the air and transmits the RF signal through an antenna.

The transmission data is carried in an agreed format frame. In the frame, a preamble symbol is composed of pilot subcarriers and a data symbol is composed of data subcarriers and pilot subcarriers.

Concerning the data symbol, transmit power changes depending on transmission data allocation. With the time-domain gain control in the automatic gain controller illustrated in FIG. 1, however, a channel-incurred power change in a received signal cannot be compensated for successfully.

Accordingly, the OFDM communication system such as an IEEE 802.16 communication system performs automatic gain control on a frame basis using a preamble symbol in each frame that is transmitted with a constant transmit power. That is, the gain of an entire frame is controlled using the power measurement of a preamble symbol included in the frame.

FIG. 5 is a block diagram of a receiver in the typical OFDM communication system.

Referring to FIG. 5, an RF processor 510 downconverts an RF signal received through an antenna to a baseband signal. An ADC 515 converts the baseband analog signal to digital time sample data.

A filter 520 is used to make the digital signal distinctive and stable. A Fast Fourier Transform (FFT) processor 525 converts the time sample data received from the filter 520 to frequency data by FFT.

A subcarrier demapper 530 extracts data subcarriers carrying actual data from the frequency data. A demodulator 535 demodulates the data subcarriers in a predetermined demodulation scheme. A decoder 540 channel-decodes the demodulated data at a predetermined coding rate, thus recovering information data. The decoding may involve deinterleaving.

The IEEE 802.16 communication system usually uses beamforming in order to improve the reception performance of a user terminal. The beamforming applies only to predetermined symbols in a frame, effecting reception of a strong signal of 6 to 12 dB at the user terminal.

However, the frame-based AGC is not viable for a beamformed symbol period covering a predetermined number of symbols in a frame. Therefore, a large dynamic range must be designed for a received signal.

Accordingly, there exists a need for an improved apparatus and method for performing automatic gain control by measuring signal characteristics of a beamformed symbol period and controlling a dynamic range for a beamformed signal based on the measurement.

SUMMARY OF THE INVENTION

Exemplary embodiments of the present invention address at least the above problems and/or disadvantages and provide at least the advantages described below. Accordingly, an aspect of exemplary embodiments of the present invention is to provide an AGC apparatus and method in a BWA communication system.

Another aspect of exemplary embodiments of the present invention is to provide an AGC apparatus and method for performing AGC by measuring signal characteristics of a beamformed symbol period and controlling a dynamic range for a beamformed signal based on the measurement in a BWA communication system.

A further aspect of exemplary embodiments of the present invention is to provide an AGC apparatus and method for performing AGC on a signal within a beamformed symbol period by detecting the beamformed symbol period based on frame configuration information included in symbols at the start of a frame, and measuring the difference between the signal characteristics of the beamformed symbol period and a non-beamformed symbol period in a BWA communication system.

According to one aspect of exemplary embodiments of the present invention, there is provided an AGC apparatus in a BWA communication system, in which a MAP interpreter detects a beamformed symbol period in an $(n-1)^{th}$ signal, a symbol power calculator measures an average signal level of a symbol in an $n^{th}$ signal, and a beamforming gain calculator calculates a beamforming gain of the $n^{th}$ signal by adding a beamforming gain of the $(n-1)^{th}$ signal to a power difference between a signal of a beamformed symbol period and a signal of a non-beamformed symbol period in the $n^{th}$ signal using information about the beamformed symbol period of the $(n-1)^{th}$ signal and the average signal level of the symbol in the $n^{th}$ signal.

BRIEF DESCRIPTION OF THE DRAWINGS

The above and other aspects, features and advantages of certain embodiments of the present invention will become more apparent from the following detailed description when taken in conjunction with the accompanying drawings, in which:

FIG. 3 illustrates the basic structure of a downlink frame in a typical IEEE 802.16 communication system;

Throughout the drawings, the same drawing reference numerals will be understood to refer to the same elements, features, and structures.

DETAILED DESCRIPTION OF THE PREFERRED EMBODIMENTS

The matters defined in the description such as a detailed construction and elements are provided to assist in a comprehensive understanding of the embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

An AGC apparatus according to exemplary embodiments of the present invention controls the gain of a beamformed signal based on the configuration information of a received frame, such as information about the configuration of data subcarriers and pilot subcarriers in each symbol and information about beamformed symbols and non-beamformed symbols.

A description will be made below of an AGC apparatus and method in a BWA communication system according to exemplary embodiments of the present invention.

Figure 1:
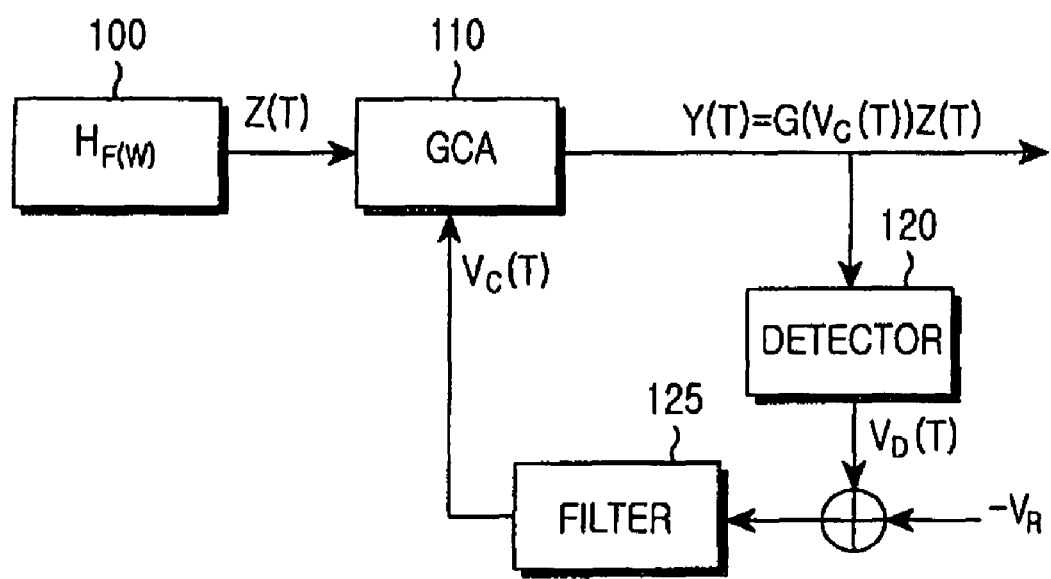
FIG. 1 is a block diagram of a typical automatic gain controller.
Figure 2:
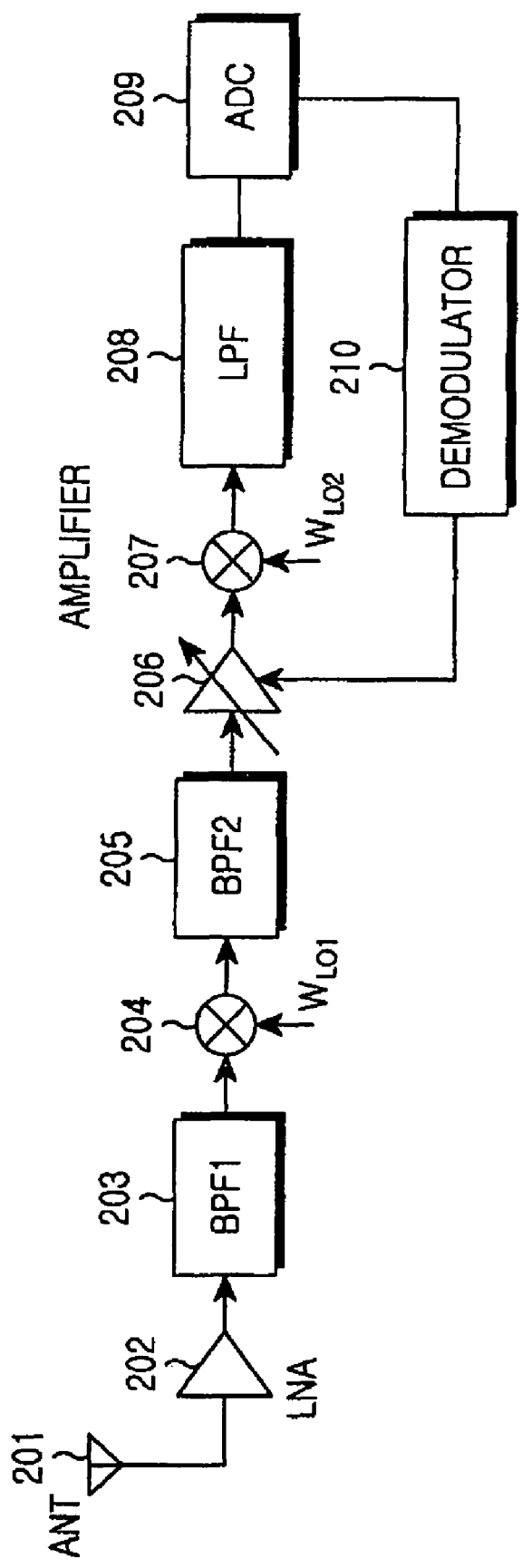
FIG. 2 is a block diagram of a typical receiver.
Figure 4:
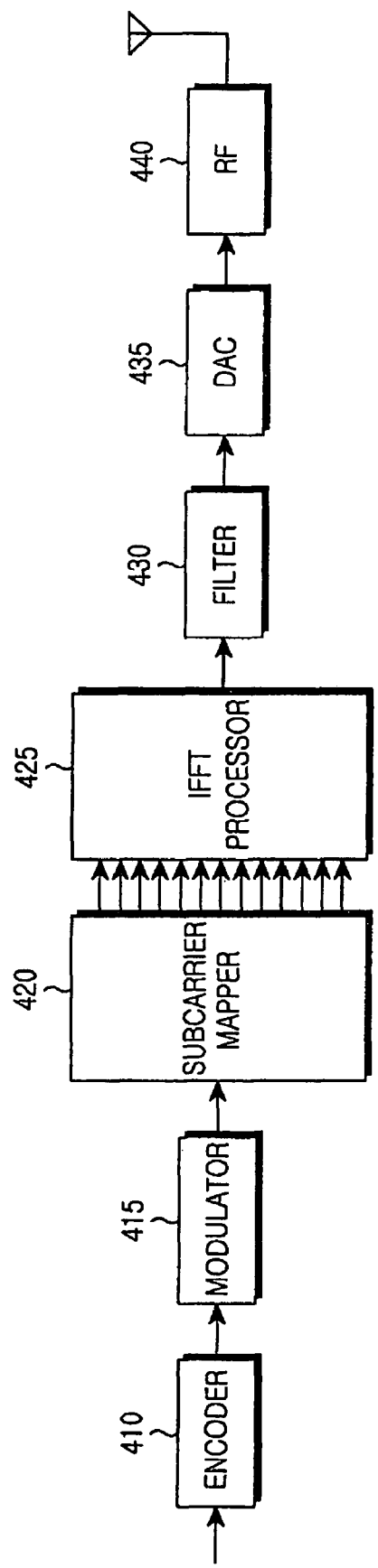
FIG. 4 is a block diagram of a transmitter in a typical OFDM communication system.
Figure 5:
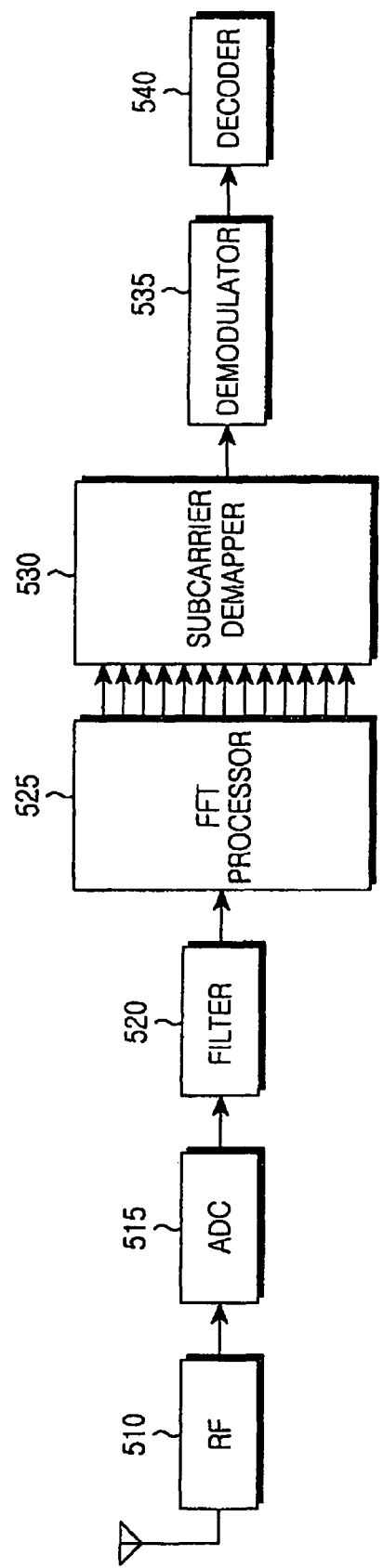
FIG. 5 is a block diagram of a receiver in the typical OFDM communication system.
Figure 6:
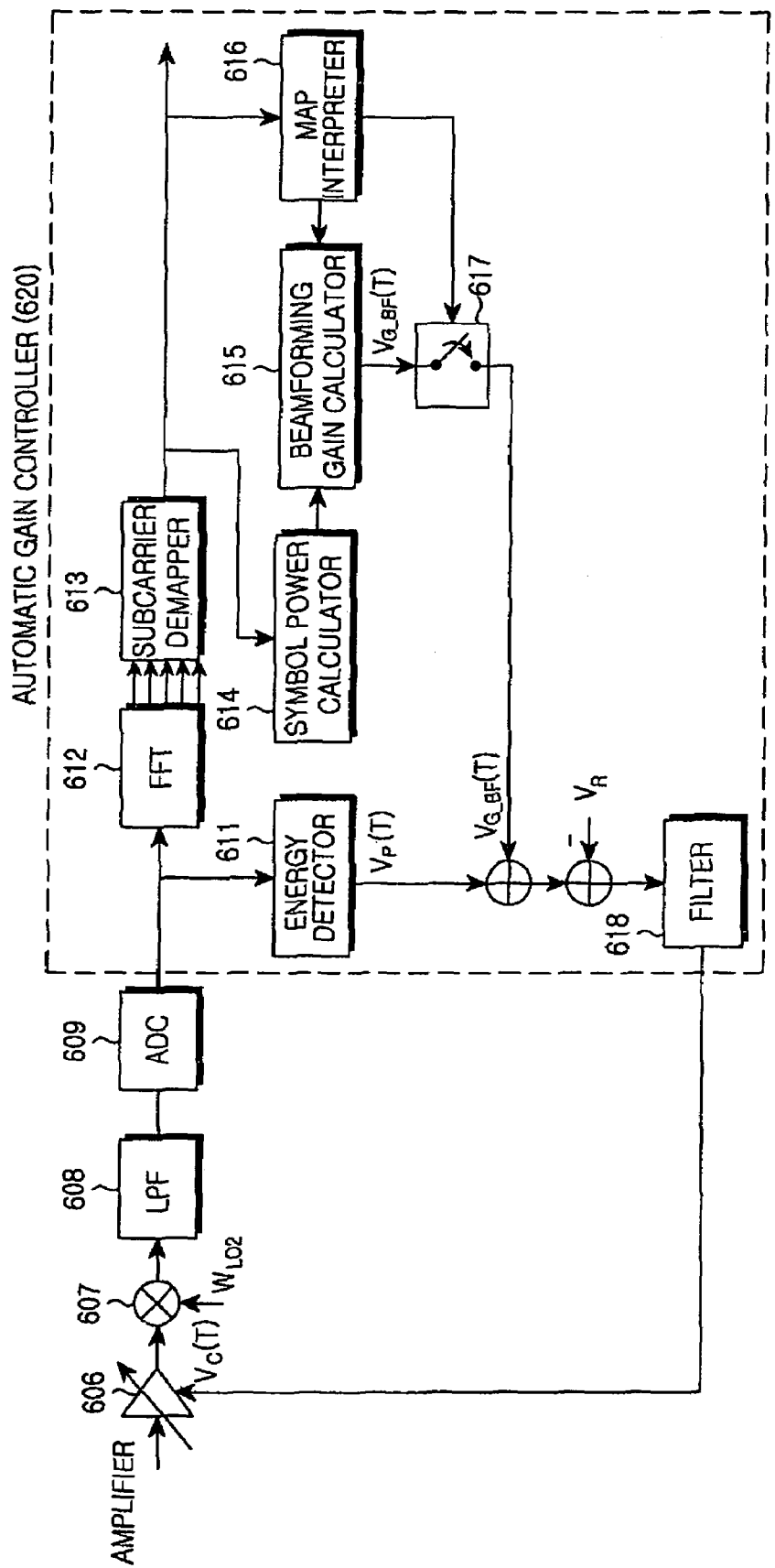
FIG. 6 is a block diagram of an AGC apparatus according to an exemplary embodiment of the present invention.

FIG. 6 is a block diagram of an AGC apparatus according to an exemplary embodiment of the present invention.

Referring to FIG. 6, a GCA 606, a frequency converter 607, an LPF 608, and an ADC 609 operate in the same manner as done conventionally.

Fast Fouier Transform (FFT) 612 converts a time domain data from Analog Digital Converter (ADC) 609 into a frequency domain data and provide the frequency domain data to a subcarrier demapper 613.

Subcarriers from the subcarrier demapper 613 are provided to a MAP interpreter 616 after modulation.

The MAP interpreter 616 can determine whether symbols in a frame were beamformed or not based on a DL-MAP of the frame. For beamformed symbols, the MAP interpreter 616 stores information indicating that the symbols are beamformed ones.

If a symbol period of the current frame corresponds to a beamformed symbol period in a previous frame, the MAP interpreter 616 notifies a beamforming gain calculator 615 accordingly and turns on a switch 617 so as to perform AGC for the symbol period.

The symbol period of the current frame indicated to the beamforming gain calculator 615 by the MAP interpreter 616 is the beamformed symbol period of the previous frame. Information about the beamformed symbol period detected from the current frame is used as a criterion for determining a beamformed symbol period of the next frame.

This is based on the assumption that the beamformed symbol period of the previous frame is highly probable to correspond to that of the current frame.

A symbol power calculator 614 measures the average signal level of each symbol of the current frame.

The beamforming gain calculator 615 calculates the difference in power between a beamformed symbol and a non-beamformed symbol in the current frame using the information about the beamformed symbol period of the previous frame and the average symbol power level of each symbol in the current frame.

The beamforming gain calculator 615 can store the average symbol power level of each symbol in the current frame for use in calculating the power difference.

The beamforming gain calculator 615 adds the power difference of the previous frame to that of the current frame and outputs the sum $V_{G\_BF}(t)$.

An energy detector 611 measures the average power level $V_p(t)$ of a preamble symbol received from the GCA 606.

An automatic gain controller 620 adds $V_p(t)$ to $V_{G\_BF}(t)$ and subtracts a reference power $V_R$ from the sum.

After a gain control value for the next frame is generated in this manner, it is passed through a filter 618, thus producing a final difference value $V_c(t)$ for use in AGC of the GCA 606.

Figure 7:
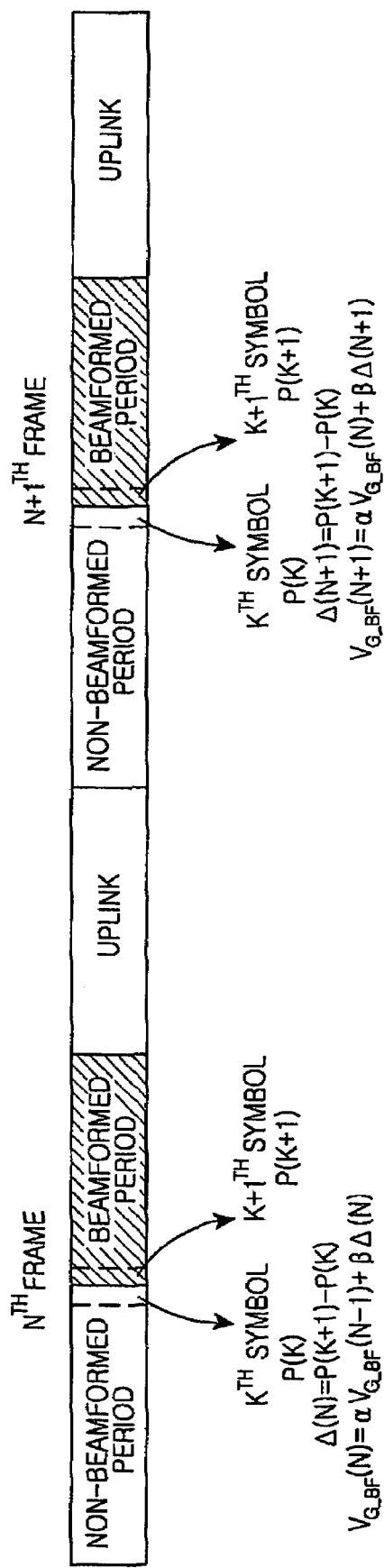
FIG. 7 illustrates an operation of the AGC apparatus for a beamformed symbol period according to an exemplary embodiment of the present invention.

FIG. 7 illustrates an operation of the AGC apparatus for a beamformed symbol period according to an exemplary embodiment of the present invention.

Referring to FIG. 7, the beamforming gain calculator 615 measures a beamforming gain by calculating the power difference between a beamformed symbol and a non-beamformed symbol ($\Delta(N)=P(k+1)-P(k)$) in each frame. The beamforming gain $V_{G\_BF}(N)$ of the current frame is calculated by $V_{G\_BF}(N)=\alpha V_{G\_BF}(N-1)+\beta\Delta(N)$ where $\alpha$ and $\beta$ are adjustment factors in measuring the beamforming gain.

The beamforming gain $V_{G\_BF}(N+1)$ of the next frame is calculated by $V_{G\_BF}(N+1)=\alpha V_{G\_BF}(N)+\beta\Delta(N+1)$ where $\alpha$ and $\beta$ are adjustment factors in measuring the beamforming gain representing the reflection ratios of power differences.

$V_{G\_BF}(N-1)$ denotes the beamforming gain of the previous frame, $V_{G\_BF}(N)$ denotes the beamforming gain of the current frame, and $V_{G\_BF}(N+1)$ denotes the beamforming gain of the next frame. $\Delta(N)$ denotes the power difference between a beamformed symbol and a non-beamformed symbol.

A gain control value for the next frame is used to change the output of the energy detector 611 in relation to the beamformed symbol period of the $(N+1)^{th}$ frame and the resulting value is used for AGC.

Figure 8:
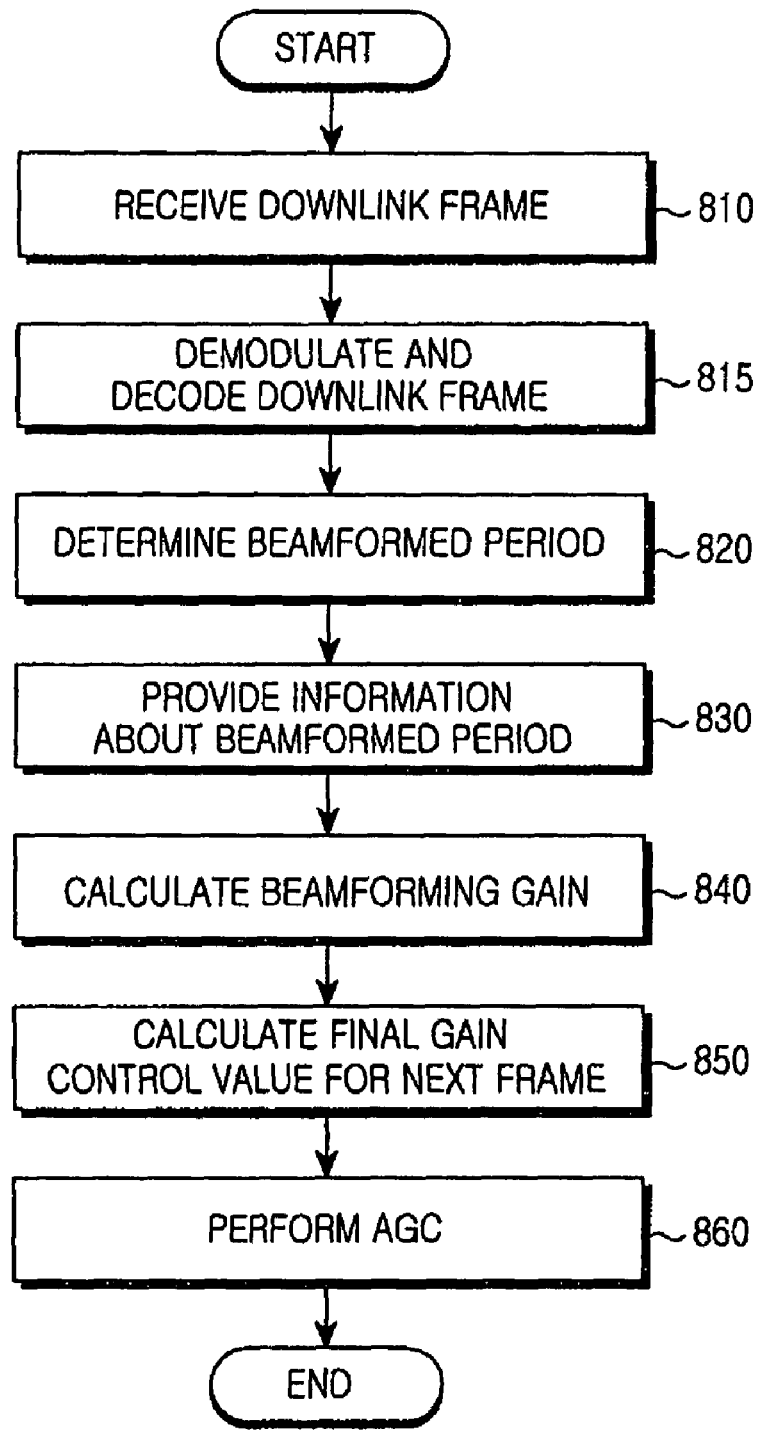
FIG. 8 is a flowchart illustrating an operation of the AGC apparatus according to an exemplary embodiment of the present invention.

FIG. 8 is a flowchart illustrating an operation of the AGC apparatus according to an exemplary embodiment of the present invention.

Referring to FIG. 8, the AGC apparatus receives a downlink frame in step 810 and demodulates and decodes the downlink frame in step 815. The MAP interpreter 616 can be responsible for the decoding. In step 820, the MAP interpreter 616 detects a beamformed symbol period from the downlink frame.

The MAP interpreter 616 notifies the beamforming gain calculator 615 of the beamformed symbol period and turns on the switch 617 when a symbol period of the current frame corresponds to a beamformed symbol period of the previous frame in step 830.

The beamforming gain calculator 615 calculates the beamforming gain of the current frame by calculating the power difference between a non-beamformed symbol and a beamformed symbol and adding the power difference to the beamforming gain of the previous frame in step 840.

Information about the beamformed symbol period of the current frame is used in determining the beamformed symbol period of the next frame.

In step 850, the automatic gain controller 620 adds the beamforming gain $V_{G\_BF}(t)$ received from the beamforming gain calculator 615 to the average signal level of a preamble symbol output from the energy detector 611 and subtracts the reference power $V_R$ from the sum, thus creating a final gain control value $V_c(t)$ for the next frame. After filtering, the final gain control value $V_c(t)$ is used in AGC of the GCA 606 in step 860.

The beamforming gain calculator 615 measures a beamforming gain by calculating the power difference between a beamformed symbol and a non-beamformed symbol in each frame ($\Delta(N)=P(k+1)-P(k)$).

The beamforming gain $V_{G\_BF}(N)$ of the current frame is given as $V_{G\_BF}(N)=\alpha V_{G\_BF}(N-1)+\beta\Delta(N)$ where $\alpha$ and $\beta$ are adjustment factors in measuring the beamforming gain, representing the reflection ratios of power differences.

Then, the algorithm of an exemplary embodiment of the present invention ends.

As is apparent from the above description, an exemplary embodiment of the present invention advantageously controls the gain of a beamformed signal by measuring the difference in signal characteristics between a non-beamformed symbol period and a beamformed symbol period using frame configuration information carried in data symbols at the start of a frame in a BWA communication system.

While certain exemplary embodiments of the invention have been shown and described herein with reference to certain preferred embodiments thereof, it will be understood by those skilled in the art that various changes in form and details may be made therein without departing from the spirit and scope of the invention as defined by the appended claims and their equivalents.

What is claimed is:

1. An Automatic Gain Control (AGC) apparatus in a wireless communication system, comprising:
    a MAP interpreter for detecting a beamformed symbol period in an $(n-1)^{th}$ signal;
    a symbol power calculator for measuring an average signal level of a symbol in an $n^{th}$ signal; and
    a beamforming gain calculator for calculating a beamforming gain of the $n^{th}$ signal by adding a beamforming gain of the $(n-1)^{th}$ signal to a power difference between a signal of a beamformed symbol period and a signal of a non-beamformed symbol period in the $n^{th}$ signal using information about the beamformed symbol period of the $(n-1)^{th}$ signal and the average signal level of the symbol in the $n^{th}$ signal.

2. The AGC apparatus of claim 1, further comprising:
    an energy detector for measuring an average signal level of a preamble symbol in the $n^{th}$ signal before the $n^{th}$ signal is processed by Fast Fourier Transform (FFT); and
    an automatic gain controller for adding the beamforming gain of the $n^{th}$ signal to the average signal level of the preamble symbol, calculating the difference between the sum and a reference power, and outputting the difference as a gain control value.

3. The AGC apparatus of claim 1, wherein the MAP interpreter detects the beamformed symbol period based on DownLink-MAP (DL-MAP) information.

4. The AGC apparatus of claim 1, wherein the beamforming gain calculator calculates the beamforming gain of the $n^{th}$ signal by the following equation, $$V_{G\_BF}(N)=\alpha V_{G\_BF}(N-1)+\beta\Delta(N) \quad (1)$$

where $V_{G\_BF}(N)$ denotes the beamforming gain of the $n^{th}$ signal, $V_{G\_BF}(N-1)$ denotes the beamforming gain of the $(n-1)^{th}$ signal, $\Delta(N)$ denotes the power difference between the signal of the beamformed symbol period and the signal of the non-beamformed symbol period in the $n^{th}$ signal, and $\alpha$ and $\beta$ denote reflection ratios of power differences.

5. An Automatic Gain Control (AGC) method in a wireless communication system, comprising the steps of:
- detecting a beamformed symbol period in an $(n-1)^{th}$ signal;
- measuring an average signal level of a symbol in an $n^{th}$ signal; and
- calculating a beamforming gain of the $n^{th}$ signal by adding a beamforming gain of the $(n-1)^{th}$ signal to a power difference between a signal of a beamformed symbol period and a signal of a non-beamformed symbol period in the $n^{th}$ signal using information about the beamformed symbol period of the $(n-1)^{th}$ signal and the average signal level of the symbol in the $n^{th}$ signal.

6. The AGC method of claim 5, further comprising the steps of:
- measuring an average signal level of a preamble symbol in the $n^{th}$ signal before the $n^{th}$ signal is processed by Fast Fourier Transform (FFT); and
- adding the beamforming gain of the $n^{th}$ signal to the average signal level of the preamble symbol and calculating the difference between the sum and a reference power.

7. The AGC method of claim 5, wherein the detection comprises detecting the beamformed symbol period based on DownLink-MAP (DL-MAP) information.

8. The AGC method of claim 5, wherein the beamforming gain calculation comprises calculating the beamforming gain of the $n^{th}$ signal by the following equation, $$V_{G\_BF}(N)=\alpha V_{G\_BF}(N-1)+\beta\Delta(N) \quad (2)$$

where $V_{G\_BF}(N)$ denotes the beamforming gain of the $n^{th}$ signal, $V_{G\_BF}(N-1)$ denotes the beamforming gain of the $(n-1)^{th}$ signal, $\Delta(N)$ denotes the power difference between the signal of the beamformed symbol period and the signal of the non-beamformed symbol period in the $n^{th}$ signal, and $\alpha$ and $\beta$ denote reflection ratios of power differences.

9. A receiver for automatic gain control in a wireless communication system, comprising:
- a MAP interpreter for detecting a beamformed symbol period in an $(n-1)^{th}$ signal;
- a symbol power calculator for measuring an average signal level of a symbol in an $n^{th}$ signal;
- a beamforming gain calculator for calculating a beamforming gain of the $n^{th}$ signal by adding a beamforming gain of the $(n-1)^{th}$ signal to a power difference between a signal of a beamformed symbol period and a signal of a non-beamformed symbol period in the $n^{th}$ signal using information about the beamformed symbol period of the $(n-1)^{th}$ signal and the average signal level of the symbol in the $n^{th}$ signal;
- an energy detector for measuring an average signal level of a preamble symbol in the $n^{th}$ signal before the $n^{th}$ signal is processed by Fast Fourier Transform (FFT); and
- an automatic gain controller for adding the beamforming gain of the $n^{th}$ signal to the average signal level of the preamble symbol, calculating the difference between the sum and a reference power, and outputting the difference as a power control value.

10. The receiver of claim 9, further comprising
- a gain control amplifier for controlling an amplification ratio for a signal received through an antenna according to the power control value received from the automatic gain controller;
- an analog-to-digital converter for converting an amplified signal received from the gain control amplifier to a digital signal;
- an FFT processor for processing the digital signal by FFT; and
- a subcarrier demapper for demapping FFT signals mapped to subcarriers, received from the FFT processor and providing the demapped signals to the MAP interpreter.

11. The receiver of claim 9, wherein the MAP interpreter detects the beamformed symbol period based on DownLink-MAP (DL-MAP) information.

12. The receiver of claim 9, wherein the beamforming gain calculator calculates the beamforming gain of the $n^{th}$ signal by the following equation, $$V_{G\_BF}(N)=\alpha V_{G\_BF}(N-1)+\beta\Delta(N) \quad (3)$$

where $V_{G\_BF}(N)$ denotes the beamforming gain of the $n^{th}$ signal, $V_{G\_BF}(N-1)$ denotes the beamforming gain of the $(n-1)^{th}$ signal, $\Delta(N)$ denotes the power difference between the signal of the beamformed symbol period and the signal of the non-beamformed symbol period in the $n^{th}$ signal, and $\alpha$ and $\beta$ denote reflection ratios of power differences.

13. A reception method for automatic gain control in a wireless communication system, comprising the steps of:
- detecting a beamformed symbol period in an $(n-1)^{th}$ signal;
- measuring an average signal level of a symbol in an $n^{th}$ signal;
- calculating a beamforming gain of the $n^{th}$ signal by adding a beamforming gain of the $(n-1)^{th}$ signal to a power difference between a signal of a beamformed symbol period and a signal of a non-beamformed symbol period in the $n^{th}$ signal using information about the beamformed symbol period of the $(n-1)^{th}$ signal and the average signal level of the symbol in the $n^{th}$ signal;
- measuring an average signal level of a preamble symbol in the $n^{th}$ signal before the $n^{th}$ signal is processed by Fast Fourier Transform (FFT); and
- adding the beamforming gain of the $n^{th}$ signal to the average signal level of the preamble symbol, calculating the difference between the sum and a reference power, and outputting the difference as a power control value.

14. The reception method of claim 13, further comprising, before the step of detecting the beamformed symbol period in the $(n-1)^{th}$ signal;
- amplifying a signal received through an antenna by controlling an amplification ratio according to the power control value;
- converting an amplified signal received from the gain control amplifier to a digital signal;
- processing the digital signal by FFT; and
- demapping FFT signals to subcarriers.

15. The reception method of claim 13, wherein the detection comprises detecting the beamformed symbol period based on DownLink-MAP (DL-MAP) information.

16. The reception method of claim 13, wherein the beamforming gain calculation comprises calculating the beamforming gain of the $n^{th}$ signal by the following equation, $$V_{G\_BF}(N)=\alpha V_{G\_BF}(N-1)+\beta\Delta(N) \quad (4)$$

where $V_{G\_BF}(N)$ denotes the beamforming gain of the $n^{th}$ signal, $V_{G\_BF}(N-1)$ denotes the beamforming gain of the $(n-1)^{th}$ signal, $\Delta(N)$ denotes the power difference between the signal of the beamformed symbol period and the signal of the non-beamformed symbol period in the $n^{th}$ signal, and $\alpha$ and $\beta$ denote reflection ratios of power differences.

* * * * *